(12) United States Patent
Sargent

(10) Patent No.: US 9,030,189 B2
(45) Date of Patent: May 12, 2015

(54) QUANTUM DOT PHOTO-FIELD-EFFECT TRANSISTOR

(76) Inventor: Edward Hartley Sargent, Toronto (CA)

(*) Notice: Subject to any disclaimer, the term of this patent is extended or adjusted under 35 U.S.C. 154(b) by 441 days.

(21) Appl. No.: 13/596,968

(22) Filed: Aug. 28, 2012

(65) Prior Publication Data

US 2013/0049738 A1 Feb. 28, 2013

Related U.S. Application Data

(60) Provisional application No. 61/528,252, filed on Aug. 28, 2011.

(51) Int. Cl.
  *G01R 31/00* (2006.01)
  *H01L 31/0352* (2006.01)
  *H01L 31/112* (2006.01)

(52) U.S. Cl.
  CPC .... *H01L 31/035218* (2013.01); *H01L 31/1129* (2013.01)

(58) Field of Classification Search
  USPC .............. 324/96, 761.01, 760.02, 762.08, 324/762.09; 257/13, 21, 24, 431, 443, 440, 257/40, E31.033, E31.053, E31.054, 257/E31.124, E31.082, 113; 438/73; 250/214.1, 208.1; 136/263, 255, 256, 136/252, 260
  See application file for complete search history.

(56) References Cited

U.S. PATENT DOCUMENTS

| 6,720,589 | B1* | 4/2004 | Shields .................... 257/194 |
| 8,154,007 | B2* | 4/2012 | Shieh et al. ................. 257/12 |
| 8,643,058 | B2* | 2/2014 | Bawendi et al. ............ 257/187 |
| 2007/0057144 | A1* | 3/2007 | Asano ...................... 250/200 |
| 2010/0301216 | A1 | 12/2010 | Vardi et al. |
| 2011/0036971 | A1 | 2/2011 | Ho et al. |
| 2011/0240106 | A1 | 10/2011 | Tang et al. |

OTHER PUBLICATIONS

Osedach, T. et al., "Lateral heterojunction photodetector consisting of molecular organic and colloidal quantum dot thin films", Appl. Phys. Lett. 94, 043307 (2009).
Gansen E. et al., "Photon-number-resolving capabilities of a semiconductor quantum dot, optically gated, field-effect transistor", QELS '07, May 6-11, 2007.

* cited by examiner

*Primary Examiner* — Huy Q Phan
*Assistant Examiner* — Thang Le
(74) *Attorney, Agent, or Firm* — Lynn C. Schumacher; Stephen W. Leonard; Hill & Schumacher

(57) ABSTRACT

Photo-field-effect transistor devices and associated methods are disclosed in which a photogate, consisting of a quantum dot sensitizing layer, transfers photoelectrons to a semiconductor channel across a charge-separating (type-II) heterointerface, producing a sustained primary and secondary flow of carriers between source and drain electrodes. The light-absorbing photogate thus modulates the flow of current along the channel, forming a photo-field effect transistor.

20 Claims, 5 Drawing Sheets

QUANTUM DOT PHOTO-FIELD-EFFECT TRANSISTOR

BACKGROUND

Photodetectors often function either as photodiodes or as photoconductors: photodiodes offer fast response and low dark current, while photoconductors provide built-in gain associated with the use of long-lived sensitizing centers. The concept of a phototransistor, such as a photo-field-effect-transistor, offers an attractive possibility: gain united with a lowered dark current compared to the photoconductor, achieved if the thickness of the current-carrying channel can be chosen independently from the thickness of the light-absorbing layer.

SUMMARY

PhotoFET devices and associated methods are disclosed in which a photogate, consisting of a quantum dot sensitizing layer, transfers photoelectrons to a semiconductor channel across a charge-separating (type-II) heterointerface, producing a sustained primary and secondary flow of carriers between source and drain electrodes. The light-absorbing photogate thus modulates the flow of current along the channel, forming a photo-field effect transistor.

Accordingly, in one aspect, there is provided a photo-field effect transistor device comprising: an electrically insulating substrate; source and drain electrodes provided on the substrate in a spaced relationship; a carrier-accepting semiconductor channel contacting the substrate between the source and drain electrodes, wherein the carrier-accepting semiconductor channel is in electrical communication with the source and drain electrodes; and a light absorbing quantum dot sensitizing layer contacting the carrier-accepting semiconductor channel, the quantum dot sensitizing layer producing photo-generated carriers under illumination of light within a selected optical bandwidth; wherein an interface between the quantum dot sensitizing layer and the carrier-accepting semiconductor channel forms a type-two heterojunction configured to inject one type of the photo-generated carriers into the carrier-accepting semiconductor channel, thereby producing primary photocarriers within the carrier-accepting semiconductor channel; and wherein the carrier-accepting semiconductor channel is characterized by a mobility such that under application of a voltage difference between the source and drain electrodes and under illumination of the quantum dot sensitizing layer, a photocurrent is produced due to injection of the primary photocarriers and recirculation of secondary photocarriers.

In another aspect, there is provided a method of generating photoconductive gain in a photo-field effect transistor device as described above, the method comprising:
  illuminating said photo-field effect transistor device with light within said selected optical bandwidth, wherein said photo-field effect transistor device is illuminated from a side associated with said quantum dot sensitizing layer;
  applying a voltage difference between said source and drain electrodes; and
  detecting a resulting photocurrent.

A further understanding of the functional and advantageous aspects of the disclosure can be realized by reference to the following detailed description and drawings.

BRIEF DESCRIPTION OF THE DRAWINGS

Embodiments will now be described, by way of example only, with reference to the drawings, in which.

DETAILED DESCRIPTION

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure. It should be understood that the order of the steps of the methods disclosed herein is immaterial so long as the methods remain operable. Moreover, two or more steps may be conducted simultaneously or in a different order than recited herein unless otherwise specified.

As used herein, the terms, "comprises" and "comprising" are to be construed as being inclusive and open ended, and not exclusive. Specifically, when used in the specification and claims, the terms, "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately", when used in conjunction with ranges of dimensions of particles, compositions of mixtures or other physical properties or characteristics, are meant to cover slight variations that may exist in the upper and lower limits of the ranges of dimensions so as to not exclude embodiments where on average most of the dimensions are satisfied but where statistically dimensions may exist outside this region. It is not the intention to exclude embodiments such as these from the present disclosure.

Embodiments disclosed herein include photo-field effect transistors (photo-FET) and associated methods, in which a quantum dot sensitizing layer is interfaced with a semiconductor channel for generating a photogate formed by a type two, charge-separating semiconductor heterostructure. In some example implementations, photoFET devices are provided in that are capable of broad spectral detection, spanning the visible and portions of the short-wavelength infrared spectral region, with a photoconductive gain, while maintaining a low dark current.

Figure 1A:
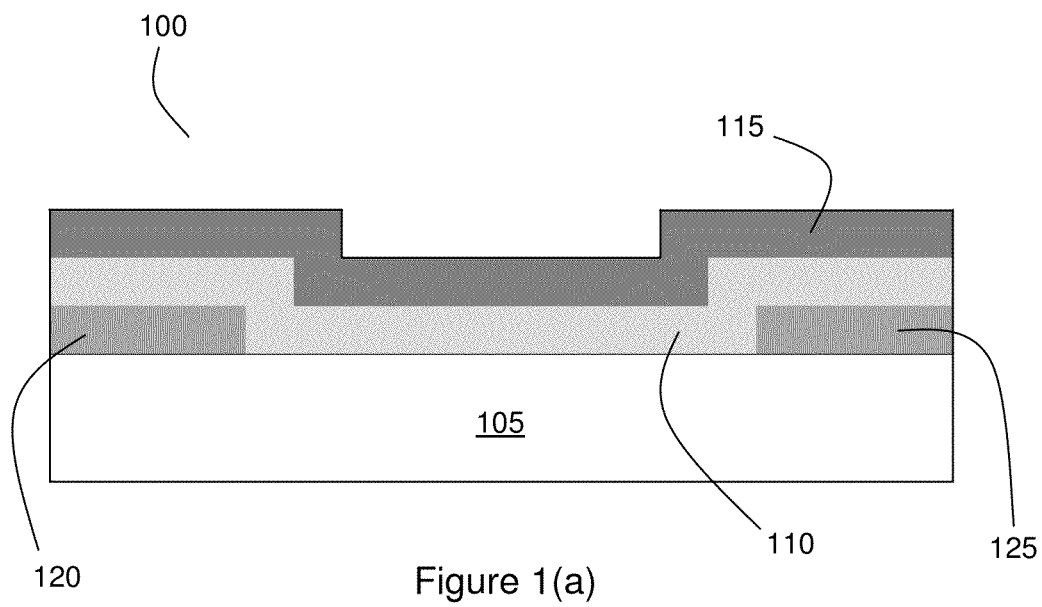
FIG. 1 shows (a) an example illustration of a photoFET device according to one embodiment, and (b) an energy level diagram illustrating the injection of photocarriers from the quantum dot sensitizing layer into the semiconductor channel.
Figure 1B:
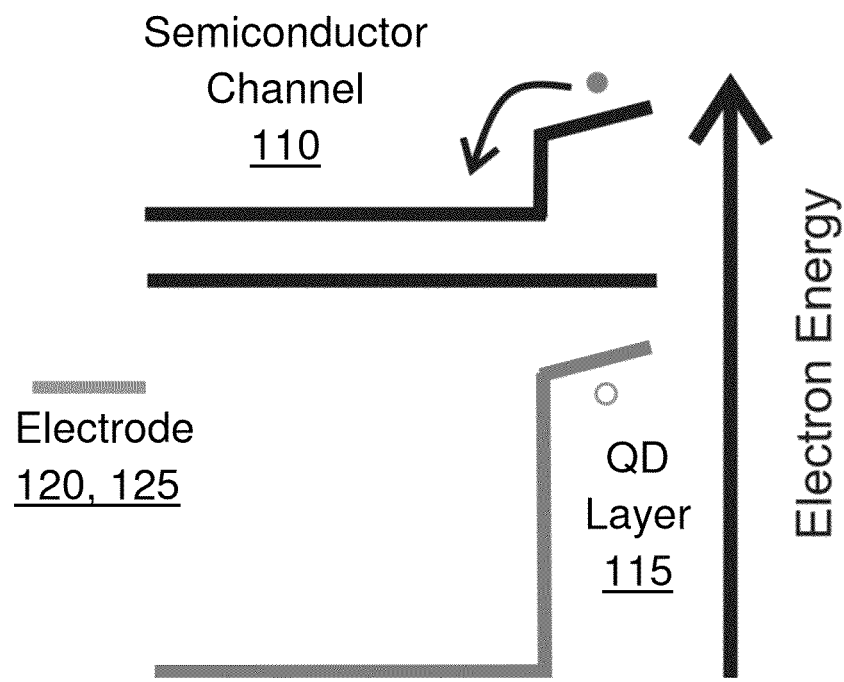

Referring now to FIG. 1 (a), a photoFET device 100 is shown in which photogenerated charges are transferred from light absorbing quantum dot sensitizing layer 115 to a carrier-accepting semiconductor channel 110, where the semiconductor channel 110 is provided on an electrically insulating substrate 105. As shown in FIG. 1 (b), the charge separation of photogenerated carriers at the type-II heterojunction interface between the quantum dot sensitizing layer and the semiconductor channel causes the injection of primary photocarriers into the semiconductor channel. FIG. 1 (b) illustrates an example implementation in which electrons are injected as a primary photocarrier. It is to be understood that the quantum dot sensitizing layer and the semiconductor channel may instead be configured, via material selection and/to processing (e.g. doping), such that the injected primary photogenerated carrier may be holes.

The injected photocarriers drift under an applied voltage between source and drain electrodes 120 and 125, and are replenished due the presence of the residual charge within the quantum dot sensitizing layer, which enables the detection of light, absorbed in the quantum dot sensitizing layer, with a photoconductive gain being experienced in the overall device. Photocurrents with photoconductive gain are therefore detected through the recirculation of the secondary injected photocarriers flowing along the channel between the source and drain electrodes under the application of a voltage, in the presence of the residual charge within the quantum dot sensitizing layer. The photocurrent is terminated via electron back-recombination across the interface.

As described above, the sensitizing layer, in which incident light is absorbed, includes quantum dots, such as colloidal quantum dots (CQDs), as the sensitizing material to form the photo gate. The bandgap of CQD nanoparticles can be tuned by varying their size; thus the spectral range of light sensing in a photodetector can also be varied through the size of the CQD nanoparticles. Since CQDs are solution processable, they are compatible with low-cost, large-area fabrication processes.

In some embodiments, the quantum dot sensitizing layer has a thickness that is sufficient to absorb a substantial portion of incident light, optionally within a pre-selected spectral window or band. In the examples provided below, the quantum dot sensitizing layer is formed from PbS nanoparticles. In such an example, the quantum dot layer may be provided with a thickness of at least 30 nm. In general, the quantum dot sensitizing layer may be selected to enable the complete absorption of visible-wavelength light, which can typically be achieved, for example, using PbS nanoparticle layers in the range of approximately 300-600 nm. In certain applications, it may be of interest to absorb within a spectral window out to the excitonic wavelength of the quantum dot layer. In these applications, a quantum dot layer thickness of approximately 600-2000 nm may be required to absorb substantially all of the light in this window in a single pass through the quantum dot layer.

It is to be understood the quantum dot sensitizing layer may be configured to possess sufficiently high carrier mobility such that a fraction of the substantial fraction of one type of the photogenerated carriers (e.g. photogenerated electrons or holes) can be into injected into the semiconductor channel. In the case in which minority carrier diffusion determines the transport of charge carriers from the quantum dot layer to the channel, a minority carrier diffusion length that exceeds the quantum dot layer thickness is preferred. For example, to achieve a 1 um minority carrier diffusion length (Ld), if the minority carrier lifetime is 1 microsecond, an approximate minority carrier mobility $(mu) > L_d^2/\text{lifetime} > 0.01 \text{ cm}^2/\text{Vs}$ is desirable.

Other suitable nanoparticles/nanocrystals for forming the quantum dot sensitizing layer may include any one or more of PbS nanoparticles, PbSe nanoparticles, CdS nanoparticles, CdSe nanoparticles, ZnS nanoparticles, and PbS nanoparticles. In each case, such nanoparticles can be synthesized in the solution phase, for example using a combination comprising (1) a metal precursor (e.g. Pb, Cd, Zn); (2) a coordinating solvent (e.g. oleic acid); (3) optionally, a non-coordinating solvent to control dilution during the reaction (e.g. octadecene); and (4) a precursor to introduce the anionic species (e.g. TMS or TMSE to introduce S or Se, respectively). In one possible method of syntheses, (1) and (2) are combined (optionally with (3)) to produce a first solution in a flask and heated, and a combination of (3) and (4) are combined to produce a second solution and then injected into said first solution to produce a third solution, and said third solution is stirred. Colloidal nanoparticles nucleate and grow to a defined size typically having a small range of diameters. In preferred embodiments, nanoparticles having target diameters in the range of 1-10 nm are synthesized using this method, and have a range of diameters that falls within 10% of the target diameter.

The semiconductor channel may be selected as an electron-accepting layer, or a hole-accepting layer. In the examples provided below, the semiconductor channel is an electron accepting layer formed from aluminum doped ZnO. The semiconductor channel be formed from other semiconductor materials such as, but not limited to, graphene, carbon nanotubes, TiO2, ZrOx, and ZnO.

The charge-accepting semiconductor channel may have a thickness less than approximately 50 nm, such as, but not limited to, approximately 1 nm. In certain embodiments, the semiconductor channel is made using a material that is prone to accept electrons from the quantum dot sensitizing layer. This may be achieved if the electron affinity of the semiconductor channel lies energetically deeper than the electron affinity of the sensitizing layer, a configuration that results in it being energetically favourable for photoelectrons generated in the quantum dot sensitizing layer to be transferred to the semiconductor channel.

In certain embodiments, the semiconductor channel may be made using a material that is prone to accept holes from the sensitizing layer. This may be achieved if the ionization potential of the semiconductor channel lies energetically shallower than the ionization potential of the sensitizing layer, a configuration that results in it being energetically favourable for photoholes generated in the sensitizing layer to be transferred to the channel.

In some embodiments, the semiconductor channel is provided with a mobility and a thickness such that a photoconductive gain is obtained, while maintaining a low dark current, such as a dark current below approximately 0.1 fA for a photodetector having an area (viewed from the top) of 1 um^2. Such a low dark current may be obtained, for example, by selecting a semiconductor channel material with a mobility greater than or equal to approximately 10-4 cm2/Vs; a thickness of 1 nm; an equilibrium free carrier density less than 1014 cm-3; for the case of a photodetector having an area viewed from the top of 1 um2.

The source and/or drain electrodes may include, but are not limited to, conductive materials such as TiN, TaN, Al, W, Au, Pt, Pd, polySi, and PtSi. In the example of a photodetector having area, viewed from the top, of 1 um2, the source and drain electrodes may each have linear dimensions of order, or slightly less than, the linear dimensions of the pixel (e.g. of the order of or slightly less than 1 um); the width of said electrodes should be small, subject to the technological constraints of their definition (e.g. subject to design rules for top metal in a CMOS silicon integrated circuit technology process, such as top surface metal dimensions of 0.35 um or larger).

In other embodiments, the incorporation of oxygen or other dopants may be employed to control the transport and trapping properties within the channel, such that the properties of the semiconductor channel are effectively tunable via stoichiometry. This provides an added degree of freedom in controlling the flow of dark current; the temporal response of the device; and the optimal operating bias.

For example, if the semiconductor channel is aluminum doped zinc oxide, then an increase of the oxygen partial pressure during the deposition of the AZO channel material may be employed to vary the electron affinity. However, this may also decrease the conductivity of the AZO film as a result of decreasing oxygen vacancies in the AZO film. Such oxygen vacancies may serve as traps, causing carriers to recombine and therefore may lead to a decrease in the gain of the photoFET. Indeed, in the Examples section below, the external gain was found to decrease as the oxygen partial pressure is increased. In addition, as a result of the reduced trap density with increased oxygen partial pressure, temporal response as well as dark current of the fabricated devices significantly improved—a substantial fast-response component coincident with reduced dark current appears in the photocurrent response signal as the oxygen content of the AZO is changed from 5% to 20% (see FIGS. 5(a-d)).

In other embodiments, the temporal response of the photoFET, for a certain electrode material, can also be significantly manipulated through proper selection of the size of CQDs. Such control is evidenced in FIGS. 5(a,c), which demonstrate the ability to vary, and optionally optimize, the photoFET properties through the joint selection of nanocrystals/quantum dots and semiconductor channel.

The following examples are presented to enable those skilled in the art to understand and to practice embodiments of the present disclosure. They should not be considered as a limitation on the scope of the present embodiments, but merely as being illustrative and representative thereof. Results are provided for a wide range of colloidal quantum dot sizes of PbS quantum dots forming the quantum dot sensitizing layer, corresponding to bandgaps ranging from 730 to 1475 nm, and various stoichiometries of aluminum-doped ZnO (AZO) channel materials are investigated.

EXAMPLES

The present examples describe the fabrication of an example photoFET device, its operation, and performance. In these examples, a sub-monolayer films of PbS CQD of a variety of sizes is employed as the sensitizing material, and aluminum-doped zinc oxide (AZO) serves as an electron-accepting channel. Conductivity-enhancing treatments are not applied to the CQD films in the examples, where instead of employing crosslinking treatments using short dithiols [2], the quantum dots are capped with oleic acid. It is to be understood that in other embodiments, the quantum dot sensitizing layer need not be provided as a monolayer, and may include conductivity-enhancing treatments, as the particular implementations disclosed in the Examples section were adapted to ensure that the photogate material has negligible conductance compared to the channel, so that the experimental measurements focused on electron injection into the channel, followed by conduction within the channel.

Figure 2A:
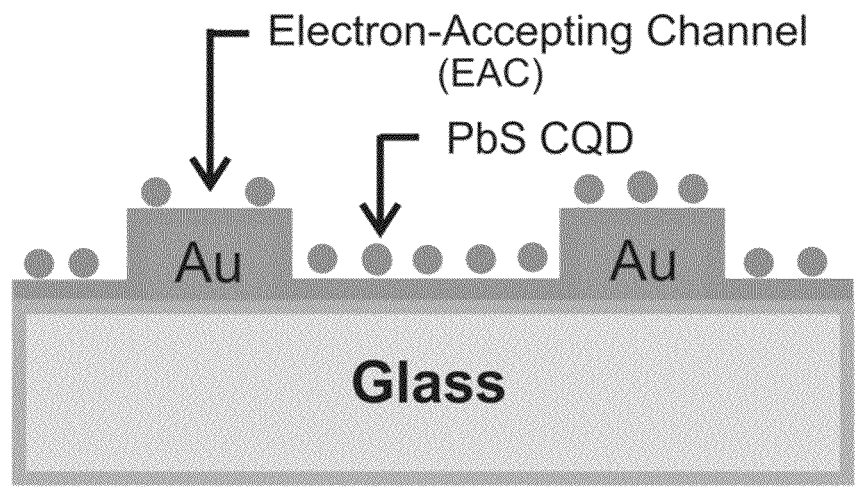
FIG. 2 shows (a) an illustration of the device structure employed in the present example, and (b) energy band diagram showing dissociation of electrons upon photo-excitation at the oxide semiconductor and the colloidal quantum dot interface. Photo-excited electrons are subsequently collected through the Au electrode by applying an electric field.
Figure 2B:
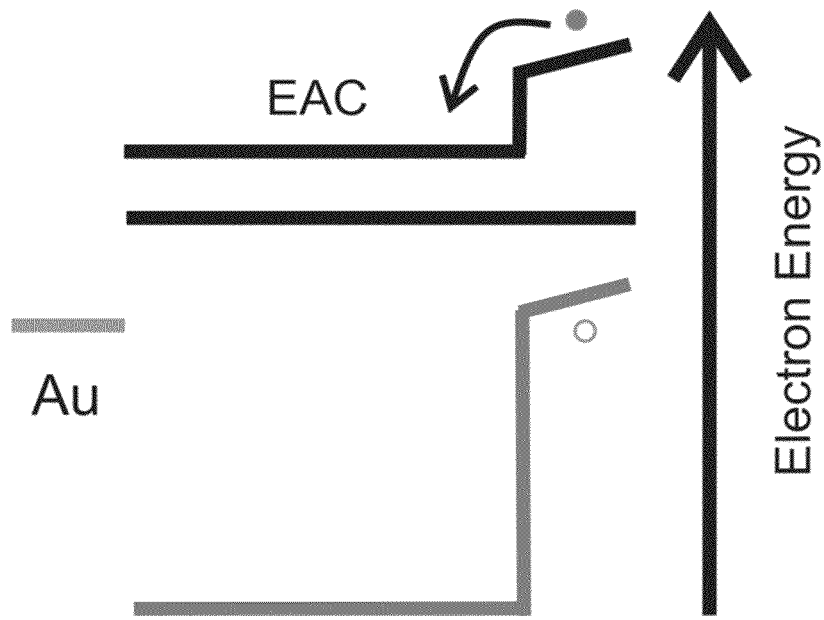

FIG. 2 is a schematic of the photoFET, which is comprised of an electron-accepting channel (EAC) atop a glass substrate with pre-pattered gold electrodes, with spacings ranging from 2.5 um to 100 um and 3 mm length. This EAC consisted of an AZO film of 50 nm thickness, deposited through RF sputtering directly onto the patterned glass substrate. PbS CQDs of ultra-low concentration (0.5 mg/mL), dispersed in octane, were spin-cast onto the AZO covered substrate, and then removed on and near the contact pads to ensure that the film in confined to the active region of the device. An electric field was applied across the source and the drain electrodes to collect photocharges transferred to the channel upon photo-excitation.

The AZO channel was deposited using an RF sputtering system (Angstrom Engineering) under oxygen partial pressures ([O2]:[O2+Ar]) of 5%, 10%, and 20%. Introduction of oxygen increases the resistivity of the film and also changes the electron affinity of the AZO material. The electron affinity of 5%, 10%, and 20% oxygen-rich AZO films was measured with cyclic voltammetry [3], yielding −4.2 eV, −4.34 eV and −4.39 eV compared to the vacuum level, respectively. This trend is consistent with published findings that the electron affinity of AZO films becomes deeper as the oxygen content is increased during deposition [4].

Figure 3:
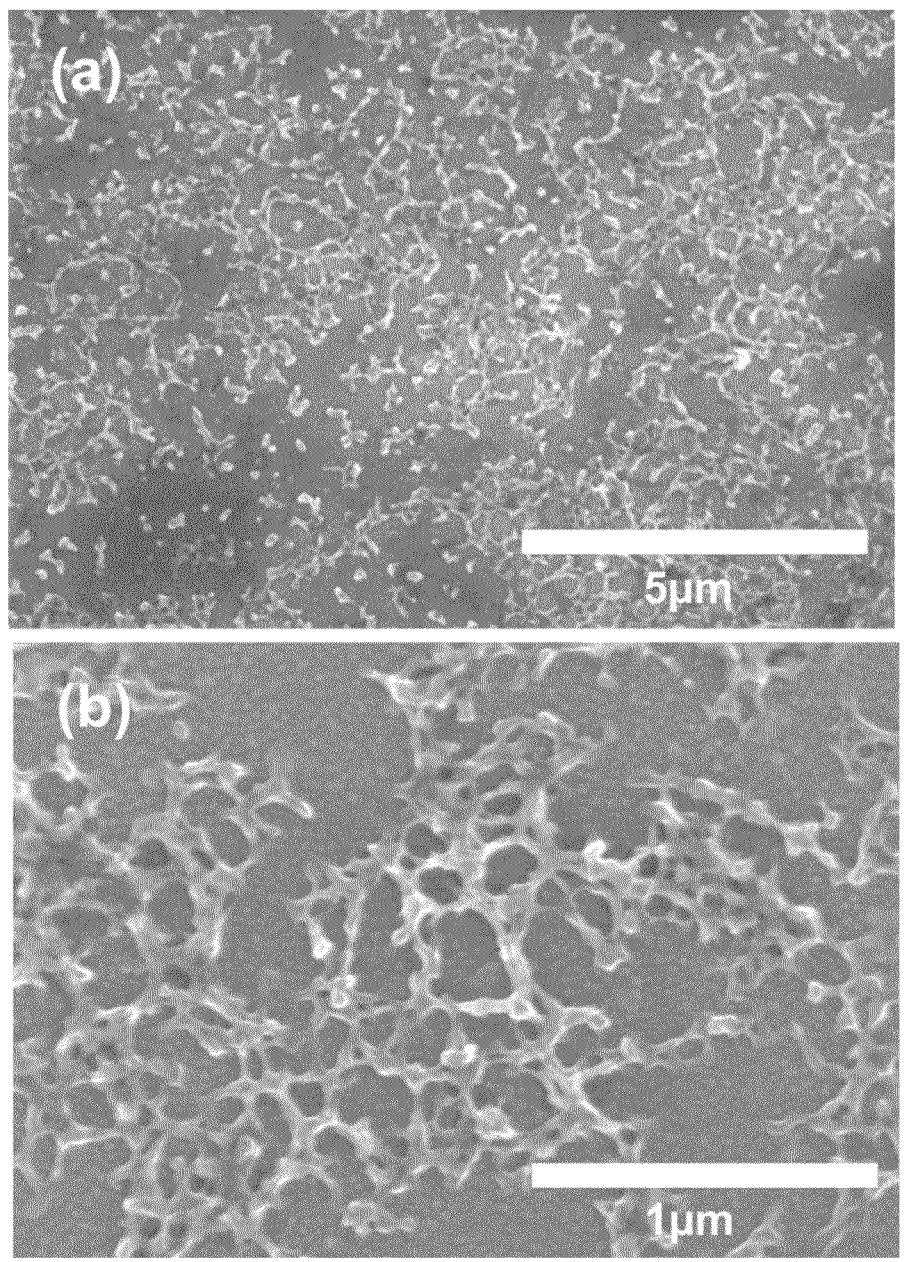
FIG. 3 shows SEM images of a colloidal quantum dot film atop AZO at magnification (a) 10 K and (b) 50 K. The CQD film was deposited by spin-coating of PbS CQDs dispersed in octane, at a concentration of 0.5 mg/mL. The images clearly show that these conditions yield the desired discontinuous CQD films.

It was confirmed with SEM that the CQD film was discontinuous (as shown in FIG. 3), thus ensuring that the only lateral conduction path was via the channel (as noted above, this is not a required feature of the device, and was included to assist in the clear interpretation of the device performance measurements). This was further confirmed by spin-coating CQDs under identical conditions onto pre-patterned substrates, without the AZO present. No measurable dark or light current was observed from these controls.

Figure 4:
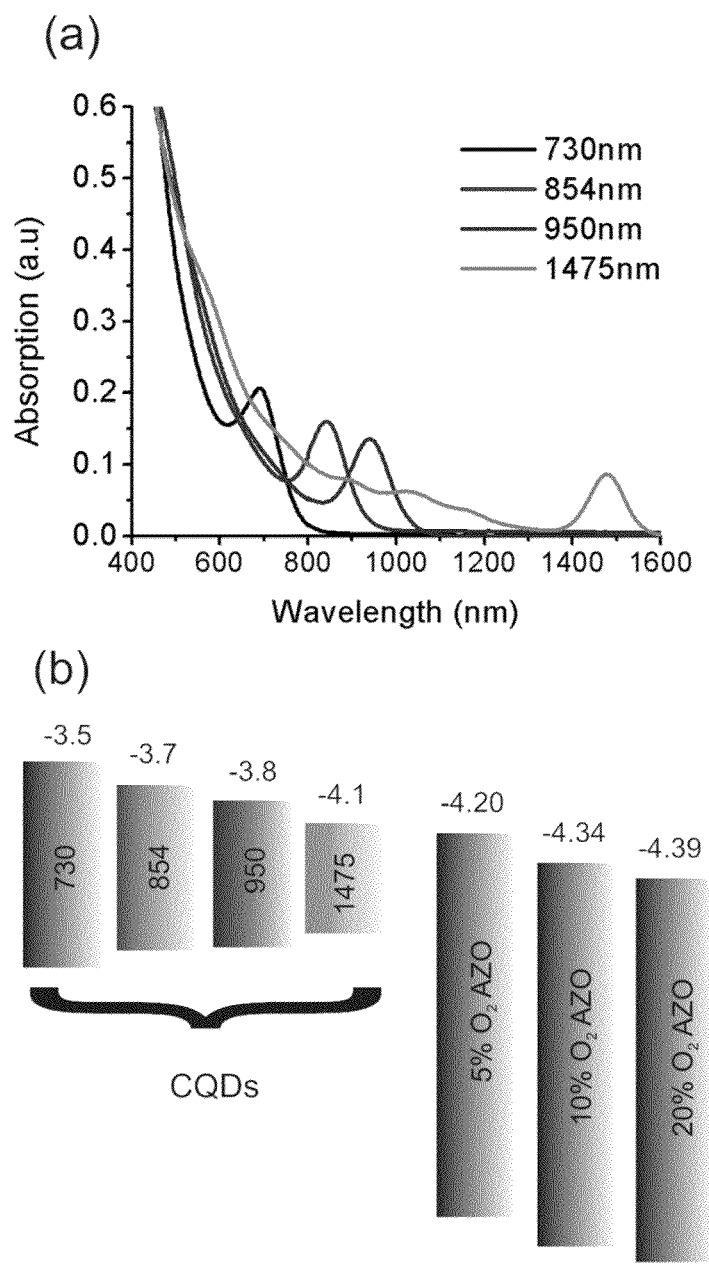
FIG. 4 plots (a) absorption spectra of different CQDs used in this study, and (b) band alignment of AZO films with respect to colloidal quantum dots. The electron affinity of AZO films was calculated from cyclic voltammetry measurements whereas the electron affinity of colloidal quantum dots was estimated based on the work of Hyun et al.

FIG. 4a shows absorption spectra of different CQD batches synthesized to yield different sizes and corresponding bandgaps of 730 nm, 854 nm, 950 nm, and 1475 nm. The FIG. 4(b) shows the relative band position of the dots with respect to the different AZO channel materials used in this study. Bandgap and the electron affinity of the CQDs were estimated based on the work of Hyun et al. [5]. With decreasing bandgap, the conduction bandedge of the CQDs comes closer to the conduction bandedge of the AZO, thus potentially decreasing the injection efficiency of photoelectrons into the channel.

All devices were fabricated under identical conditions for each CQD size-AZO channel material combination. Each sample was subsequently subjected to 627 nm light modulated at a frequency of 0.2 Hz.

Figure 5:
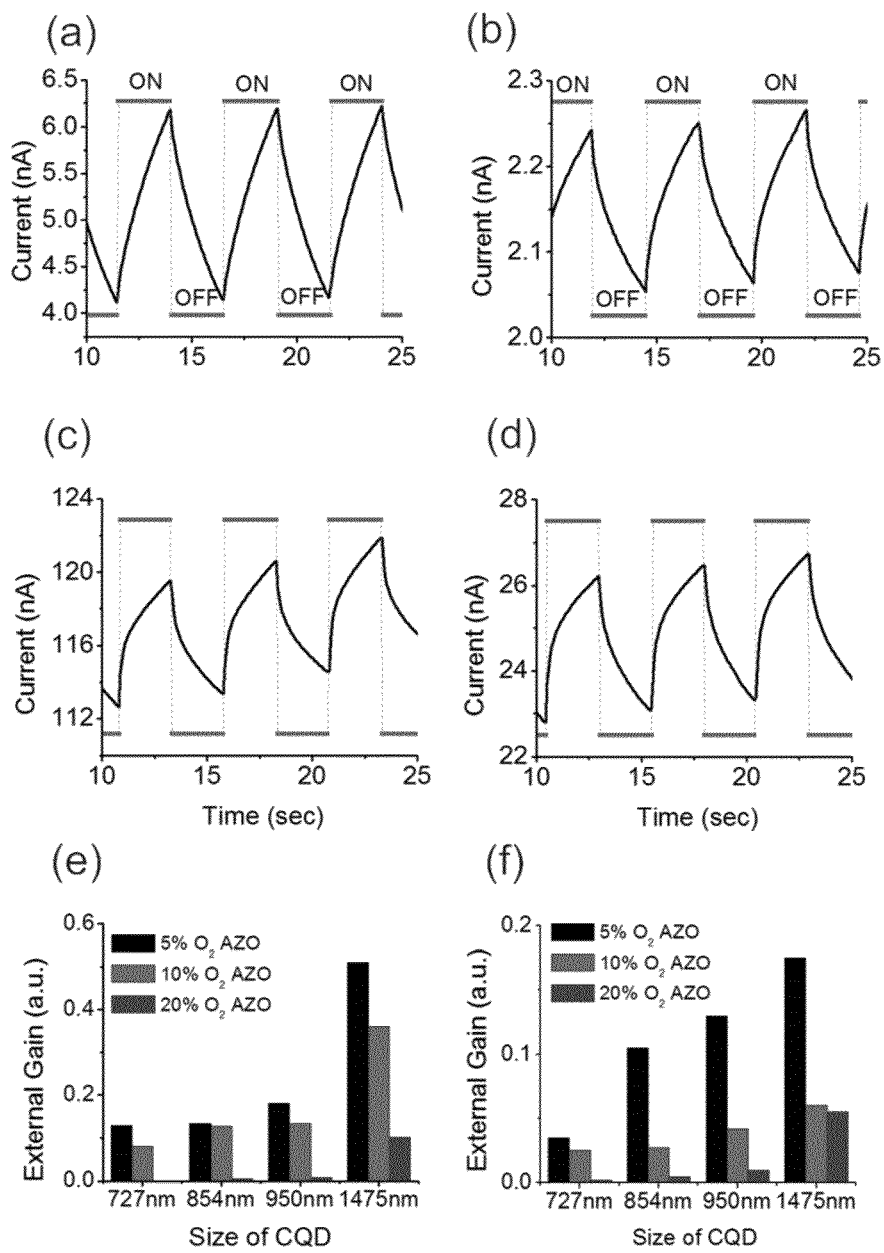
FIG. 5 plots time-dependent photoresponse (indicated by ON-OFF sequence) of sub-monolayer films of colloidal quantum dots with bandgaps of (a) and (b) 727 nm and (c) and (d) 1475 nm, on top of (a) and (c) 5% and (b) and (d) 20% O2 rich AZO channels. Measurements were carried out under an applied field of 1000 V/cm and illumination of red light (time period 5 s) of intensity 225 W/cm$^2$. Responsivities, shown on an arbitrary units scale, at illumination intensities of (e) 12 W/cm$^2$ and (f) 645 W/cm$^2$, show that gain increases as the band offset between the EAC material and the CQDs decreases. The photoconductive gain also decreases with light intensity.

FIGS. 5(a-d) show the representative time traces of the photoresponse for the large and small bandgap dots on AZO channels, deposited under low and high oxygen conditions. FIGS. 5(e) and (f) depicts the calculated external gain for the 4 dot sizes and 3 different AZO channels under different illumination intensities. It is found that the photoconductive gain increases with CQD size. In part, and without intending to be limited by theory, the increased gain is attributed to the higher absorption of sub-monolayer of the larger quantum dots [6] at the red excitation wavelength. Of principal note, though, is the fact that efficient photoelectron transfer is achieved into AZO for all choices of CQD size in this example.

The illumination intensity dependent studies show that the photoconductive gain decreases with light intensity for all CQD sizes and AZO materials used in this example (FIGS. 5(e) and (f)). Without intending to be limited by theory, this effect may be attributed to bimolecular recombination [7] or filling up of the lowest lying longest lived trap states at high intensities [8], which, in effect, decreases the external gain at higher intensity of illumination.

In further experimental studies, these results were compared with results obtained via sputtered TiO2, an electrode successfully employed in colloidal quantum dot solar cells. Cyclic voltammetry confirmed that TiO2 has a similar band-edge position to the AZO used herein. Devices employing TiO2 showed sharper temporal response, similar to the fast response component of FIG. 5(d), and at least one order of magnitude lower photoconductive gain than in the case of AZO. This change in properties may be attributed to the lower density of oxygen vacancies in the TiO2 channel material. This change in properties can be attributed to the lower trap density in the TiO2 channel material.

The results presented herein indicate that photoelectron transfer is achieved for any of the sizes of dots considered herein (730 nm bandgap to 1475 nm bandgap) to any of the AZO electrodes considered herein (−4.2 eV conduction band edge to −4.4 eV conduction bandedge). The findings suggest that AZO could in principle serve as a particularly appropriate electrode in PbS colloidal quantum dot photovoltaics seeking long-wavelength operation, such as the smallest-bandgap junction of a triple-junction solar cell (~1600 nm bandgap desired).

It is further noted that the higher response seen from the shallower-electron-affinity electrode compared to the deeper-electron-affinity electrode is not explainable by the band offsets. Instead, it may be that the oxygen concentration during sputter deposition can appreciably modify both electron mobility and trap states within the AZO. It is also noted that the dramatically higher response obtained using the smaller-bandgap quantum dots is not fully explained via higher absorption alone: combined with differences in temporal response depending on quantum dot size, these results suggest that the energy levels of the trap states at the channel-dot interface are a joint property of the quantum dots and the channel material band and trap energy levels.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

REFERENCES

1. Tim P. Osedach, Scott M. Geyer, John C. Ho, Alexi C. Arango, Moungi G. Bawendi, and Vladimir Bulovic, Applied Physics Letters 94 (4), 043307 (2009).
2. Ethan J. D. Klem, Harnik Shukla, Sean Hinds, Dean D. MacNeil, Larissa Levina, and Edward H. Sargent, Applied Physics Letters 92 (21), 212105 (2008).
3. Erol Kucur, Jurgen Riegler, Gerald A. Urban, and Thomas Nann, The Journal of Chemical Physics 119 (4), 2333 (2003).
4. S. Brehme, F. Fenske, W. Fuhs, E. Nebauer, M. Poschenrieder, B. Selle, and I. Sieber, Thin Solid Films 342 (1-2), 167 (1999).
5. B. R. Hyun, Y. W. Zhong, A. C. Bartnik, L. F. Sun, H. D. Abruna, F. W. Wise, J. D. Goodreau, J. R. Matthews, T. M. Leslie, and N. F. Borrelli, ACS Nano 2 (11), 2206 (2008).
6. C. A. Leatherdale, W. K. Woo, F. V. Mikulec, and M. G. Bawendi, The Journal of Physical Chemistry B 106 (31), 7619 (2002).
7. R. R. Mehta and B. S. Sharma, Journal of Applied Physics 44 (1), 325 (1973).
8. G. Konstantatos and E. H. Sargent, Nat. Nanotechnol. 5 (6), 391 (2010).

Therefore what is claimed is:

1. A photo-field effect transistor device comprising:
an electrically insulating substrate;
source and drain electrodes provided on said substrate in a spaced relationship;
a carrier-accepting semiconductor channel contacting said substrate between said source and drain electrodes, wherein said carrier-accepting semiconductor channel is in electrical communication with said source and drain electrodes; and
a light absorbing quantum dot sensitizing layer contacting said carrier-accepting semiconductor channel, said quantum dot sensitizing layer producing photo-generated carriers under illumination of light within a selected optical bandwidth;
wherein an interface between said quantum dot sensitizing layer and said carrier-accepting semiconductor channel forms a type II heterojunction configured to inject one type of said photo-generated carriers into said carrier-accepting semiconductor channel, thereby producing primary photocarriers within said carrier-accepting semiconductor channel; and
wherein said carrier-accepting semiconductor channel is characterized by a mobility such that under application of a voltage difference between said source and drain electrodes and under illumination of said quantum dot sensitizing layer, a photocurrent is produced due to injection of the primary photocarriers and recirculation of secondary photocarriers.

2. The photo-field effect transistor device according to claim 1 wherein a bandgap of said quantum dot sensitizing layer is smaller than a bandgap of said carrier-accepting semiconductor channel.

3. The photo-field effect transistor device according to claim 2 wherein quantum dot sensitizing layer has a bandgap configured to cause absorption of light over the selected optical bandwidth, and wherein said carrier-accepting semiconductor channel has a bandgap configured to be substantially transparent to light over said selected optical bandwidth, such that photogenerated carriers within said carrier-accepting semiconductor channel are provided predominantly through injection from said quantum dot sensitizing layer.

4. The photo-field effect transistor device according to claim 1 wherein said quantum dot sensitizing layer has thickness selected such that when the device is illuminated with light within the selected optical bandwidth from a side associated with said quantum dot sensitizing layer, a substantial fraction of incident optical power is absorbed within the quantum dot sensitizing layer.

5. The photo-field effect transistor device according to claim 1 wherein said interface between said quantum dot sensitizing layer and said carrier-accepting semiconductor channel is a type II heterojunction configured to inject electrons into said carrier-accepting semiconductor channel.

6. The photo-field effect transistor device according to claim 5 wherein said carrier-accepting semiconductor channel comprises an aluminum doped zinc oxide layer, and wherein the primary photocarriers are electrons.

7. The photo-field effect transistor device according to claim 6 wherein an oxygen content of said aluminum doped zinc oxide layer is selected to provide a suitable electron affinity for injection of the electrons.

8. The photo-field effect transistor device according to claim 7 wherein an oxygen content of said aluminum doped zinc oxide layer is between approximately 5 percent and 20 percent.

9. The photo-field effect transistor device according to claim 1 wherein said quantum dot sensitizing layer is a sub-monolayer of quantum dots.

10. The photo-field effect transistor device according to claim 1 wherein said quantum dot sensitizing layer comprises quantum dots selected from the group consisting of PbS nanoparticles, PbSe nanoparticles, CdS nanoparticles, CdSe nanoparticles, ZnS nanoparticles, and PbS nanoparticles.

11. The photo-field effect transistor device according to claim 1 wherein said carrier-accepting semiconductor channel comprises a semiconductor material selected from the group consisting of graphene, carbon nanotubes, TiO2, ZrO, and ZnO.

12. The photo-field effect transistor device according to claim 1 wherein one or both of said source and drain electrodes comprises a conductive material selected from the group consisting of TiN, TaN, Al, W, Au, Pt, Pd, polySi, and PtSi.

13. The photo-field effect transistor device according to claim 1 wherein a thickness of said carrier-accepting semiconductor channel is less than 50 nm.

14. The photo-field effect transistor device according to claim 1 wherein a mobility of said carrier-accepting semiconductor channel is greater than or equal to approximately $10^4$ cm$^2$/Vs.

15. The photo-field effect transistor device according to claim 1 wherein a diffusion length of said primary photocarriers is approximately greater than or equal to a thickness of said quantum dot sensitizing layer.

16. The photo-field effect transistor device according to claim 1 wherein minority carrier diffusion determines transport of said primary photocarriers from said quantum dot sensitizing layer to said carrier-accepting semiconductor channel, and wherein a minority carrier diffusion length of said primary photocarriers exceeds approximately 0.1 cm$^2$/Vs.

17. The photo-field effect transistor device according to claim 1 wherein a mobility, free carrier density, and thickness of said carrier-accepting semiconductor channel are selected to provide a dark current less than or equal to approximately 0.1 fA per 1 um$^2$ of surface area.

18. A method of generating photoconductive gain in a photo-field effect transistor device according to claim 1, the method comprising:
   illuminating said photo-field effect transistor device with light within said selected optical bandwidth, wherein said photo-field effect transistor device is illuminated from a side associated with said quantum dot sensitizing layer;
   applying a voltage difference between said source and drain electrodes; and
   detecting a resulting photocurrent.

19. The method according to claim 18 wherein quantum dot sensitizing layer has a bandgap configured to cause absorption of light over the selected optical bandwidth, and wherein the carrier-accepting semiconductor channel has a bandgap configured to be substantially transparent to light over the selected optical bandwidth, such that photogenerated carriers within the carrier-accepting semiconductor channel are provided predominantly through injection from the quantum dot sensitizing layer.

20. The method according to claim 18 wherein the quantum dot sensitizing layer has thickness selected such that when the device is illuminated with light within the selected optical bandwidth, a substantial fraction of the incident optical power is absorbed within the quantum dot sensitizing layer.

* * * * *